Aug. 23, 1966 J. L. BOYER 3,268,770

WATER COOLED SEMICONDUCTOR DEVICE ASSEMBLY

Filed April 2, 1964

INVENTOR.
JOHN L. BOYER
BY
OSTROLENK, FABER, GERB & SOFFEN
ATTORNEYS

United States Patent Office 3,268,770
Patented August 23, 1966

3,268,770

WATER COOLED SEMICONDUCTOR DEVICE ASSEMBLY

John L. Boyer, El Segundo, Calif., assignor to International Rectifier Corporation, El Segundo, Calif., a corporation of California Filed Apr. 2, 1964, Ser. No. 356,712
9 Claims. (Cl. 317—100)

My invention relates to a heat exchange structure and more specifically relates to a novel heat exchange mounting structure for semiconductors wherein a large and intimate but insulated heat exchange surface area is provided between a semiconductor device and its mounting structure.

It is well known that effective cooling is extremely desirable for the operation of various types of semiconductor devices. To this end, it is common practice to provide a water cooled bus structure which serves as the support for the semiconductor device and provides a heat sink for the semiconductor device.

A major problem in mounting semiconductor devices on a water cooled bus is in the provision of electrical insulation between the semiconductor device and the bus without introducing a large heat barrier to the flow of heat from the esmiconductor device to the water cooled bus.

A typical manner in which this has been previously accomplished has been to use a large surface area connection between the semiconductor mounting structure and the water cooled structure where the two are electrically insulated by virtue of a thin insulation layer in the heat transfer area. Theoretically, this type arrangement produces satisfactory results, since the thin insulation layer and large adjacent areas to the thin insulation layer introduce a small enough impedance to the flow of heat so that effective cooling can be accomplished.

As a practical matter, however, these types arrangements do not operate at best efficiency, since it is difficult to obtain a high pressure over a large area with simple clamping devices.

The present invention provides a novel structure for clamping a large area semiconductor device mounting structure to a similarly large area water cooling structure with a thin insulation layer between the two wherein the clamping operation causes the two surfaces to conform to one another. By way of example, the water cooled structure has a slightly arcuate clamping surface covered by a thin insulation layer. The mounting body for the semiconductor device will then have a flat surface which can be clamped to the water cooling surface at either of its edges. The clamping action will then cause the normally flat surface of the semiconductor-receiving structure to distort over the slightly arcuate surface of the water cooled structure, whereupon high pressure is applied over all surface areas which are separated only by the thin electrical insulation layer. This type structure then permits extremely efficient transfer of heat at low density with a low thermal drop.

Accordingly, the primary object of this invention is to permit the application of high pressure over large areas with simple clamping devices.

Another object of this invention is to provide a novel connection means for connecting the mounting structure of a semiconductor device to a water cooled structure which is electrically insulated therefrom with high thermal efficiency.

These and other objects of this invention will become apparent from the following description when taken in connection with the drawings, in which.

Figures 1, 2, 3:
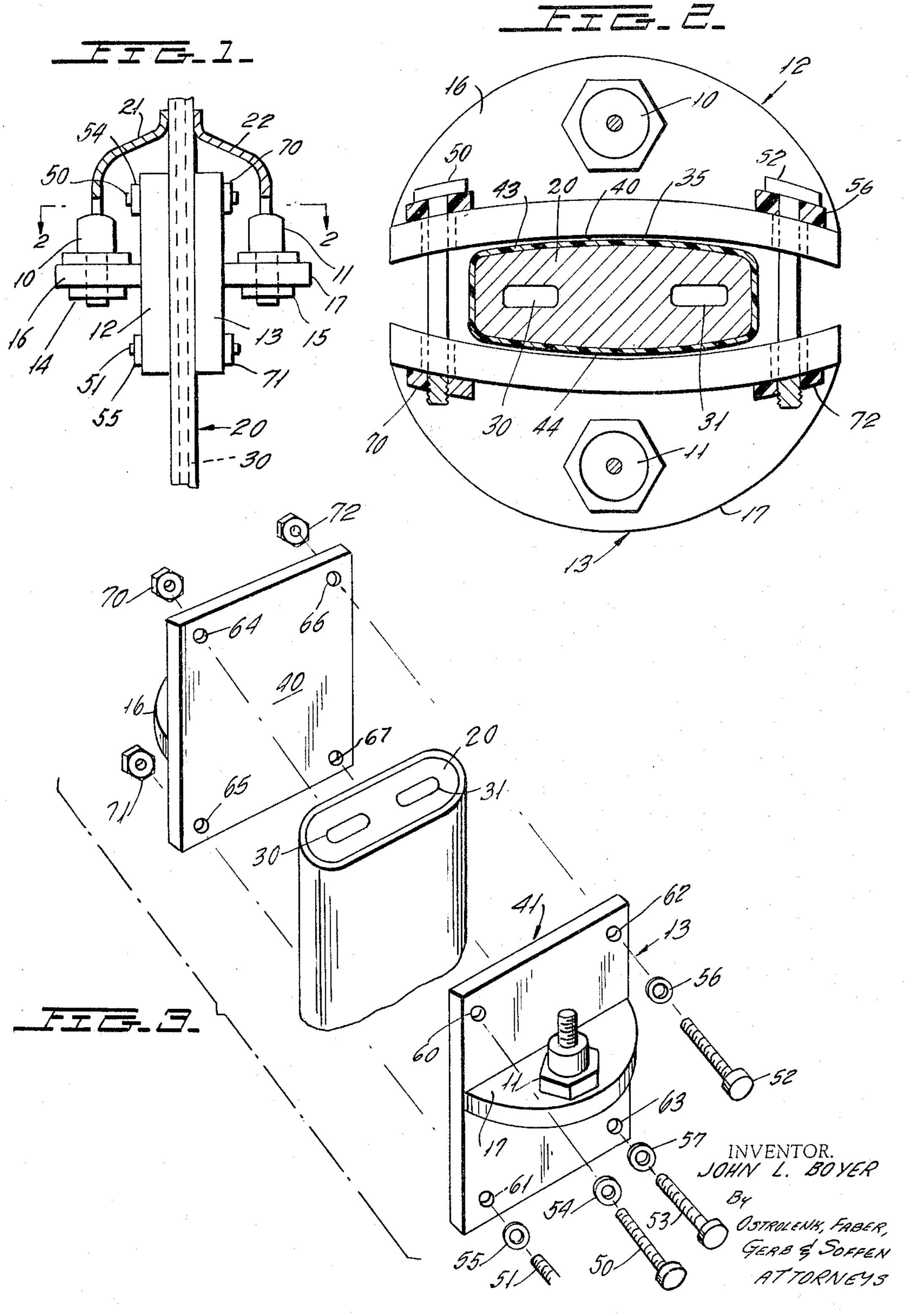
FIGURE 1 shows a side plan view of the novel clamping arrangement of the present invention wherein two semiconductor devices are supported from a water cooled structure.
FIGURE 2 is a cross-sectional view of FIGURE 1 taken across the lines 2—2 in FIGURE 1.
FIGURE 3 is an exploded perspective view of the arrangement of FIGURES 1 and 2.

Referring now to the figures, I have illustrated therein two semiconductor devices 10 and 11 of the threaded stud mounting type. The two devices 10 and 11 which are of the so-called "top hat" construction are then received by the generally T-shaped conductive mounting sections 12 and 13, respectively, which have openings therein through which the studs of devices 10 and 11 pass. These studs then receive nuts 14 and 15 which secure devices 10 and 11 to supports 12 and 13, respectively. More specifically, devices 10 and 11 are connected to the extending platform sections 16 and 17 of supports 12 and 13, respectively. Clearly, any other desired mounting arrangement can be used to mount devices 10 and 11 to platforms 16 and 17, respectively.

In accordance with the invention, and in order to obtain efficient cooling of devices 10 and 11 by heat conduction through conductive supports 12 and 13, a water cooled bus or mounting post 20 physically mounts conductive supports 12 and 13. The bus 20 also receives the upper terminal of devices 10 and 11, as schematically illustrated by flexible leads 21 and 22 of devices 10 and 11, respectively, which are electrically connected to the bus 20. Clearly, any number of conductive support members with respective semiconductor devices can be mounted along bus 20, these devices all being connected in parallel.

The bus may then have axially directed channels such as channels 30 and 31 therein which serve to conduct a cooling fluid such as water which may flow through channel 30 in a first direction and return through channel 31 in an opposite direction.

Since the bus 20 serves as a common bus conductor for each of devices 10 and 11, it is apparent that the bus 20 must be insulated from conductive supports 12 and 13. To this end, the bus 20 may have a thin insulation sheath 35 thereon of suitable material. Clearly, this insulation sheath will be removed at those points where connection is made to the pigtail conductors 21 and 22. Alternatively, the bus or post 20 may be a bare conductor with a thin sheet of insulation material interposed between the post 20 and conductive supports 12 and 13, respectively, where these supports are connected to the bus 20.

As mentioned above, a large area connection exists between opposing surfaces 40 and 41 of support structures 12 and 13, respectively, and the post 20. This large area connection, in combination with a relatively thin insulation sheath 35 or other suitable thin insulation barrier between conductive supports 12 and 13 and post 20, would provide effective heat transfer in an economical manner if it is possible to obtain a high pressure connection over these relatively large areas.

This type of high pressure connection is made possible in an economical manner in accordance with the invention by forming the surfaces of bus 20 to have a slightly arcuate configuration. More specifically, and in accordance with the invention, the surfaces 43 and 44 (FIGURE 2) of bus 20 have a convex shape which has a radius of curvature, for example, of two feet. Clearly, this can be easily accomplished during the formation of bus 20.

The opposing surfaces 40 and 41 are then made to be relatively flat with the supports 12 and 13 being so constructed that a reasonable clamping force can distort these surfaces into a configuration which cooperates with that of surfaces 43 and 44, respectively. This clamping structure may then be of a simple nature shown in the figures, and includes, for example, bolts 50, 51, 52 and 53 which pass through suitable washers 54, 55, 56 and 57, respectively, and through aligned through-openings in the conductive supports 12 and 13 such as through-openings 60, 61, 62 and 63 (FIGURE 3) and cooperating openings 64, 65, 66 and 67 in FIGURE 3.

Note that the securing bolts are spaced from one another by a sufficient dimension to span the width of bus 20, as particularly illustrated in FIGURE 2.

The ends of bolts 50 through 53 are then received by suitable nuts such as nuts 70, 71, 72 and another (not shown), respectively. In this manner, the bolts may be tightened to distort the flat surface sections of conductive supports 12 and 13 into a shape which conforms with the shape of surfaces 43 and 44 and, in so doing, creates a high pressure contact throughout the engaging areas. Note that the curvatures shown in the figures are exaggregated for purposes of clarity and that a relatively small distortion can result in extremely high pressure.

Because of this high pressure over a large area and as emphasized above, a low temperature drop results across insulation sheath 35 whereby efficient heat transfer occurs between supports 12 and 13 and post 20.

Although this invention has been described with respect to its preferred embodiments, it should be understood that many variations and modifications will now be obvious to those skilled in the art, and it is preferred therefore that the scope of the invention be limited not by the specific disclosure herein but only by the appended claims.

The embodiments of the invention in which an exclusive privilege or property is claimed are defined as follows:

1. A mounting structure for a semiconductor device; said mounting structure comprising a conductive mounting body electrically and thermally connected to said semiconductor device and having a relatively large, first clamping surface, a conductive bus support having a relatively large area second clamping surface positioned adjacent said first clamping surface of said conductive mounting body, a thin insulation sheet interposed between and coextensive with said first and second clamping surfaces, and clamping means for clamping said conductive mounting body to said conductive support; said relatively large first and second clamping surfaces and said relatively thin insulator sheet defining a low thermal impedance to heat flow between said conductive mounting body and said conductive bus support; at least one of said first or second clamping surface being normally convex toward the other of said first or second clamping surface; said clamping means distorting said normally convex clamping surface of said one of said first or second clamping surfaces to conform to the shape of the surface of the other of said first or second clamping surfaces.

2. The device substantially as set forth in claim 1 wherein one terminal of said semiconductor device is insulated from said conductive mounting body and is electrically connected to said conductive bus support.

3. The device substantially as set forth in claim 1 wherein said conductive bus support has passages therein for conducting a fluid heat exchange medium.

4. The device substantially as set forth in claim 1 wherein said thin insulation sheet comprises an insulation sheath surrounding said conductive bus support.

5. A mounting structure for a first and second electrical device each having first and second terminals; said mounting structure including first and second identical mounting bodies electrically and thermally connected to said first terminals of said first and second electrical devices and having respective first clamping surfaces, an elongated conductive bus support having a second large area clamping surfaces for receiving said first clamping surfaces of said first and second mounting bodies, respectively, and thin electrical insulation means interposed between and coextensive with each of said clamping surfaces of said first and second mounting bodies and said conductive bus support, and clamipng means extending between said first and second identical mounting bodies for clamping said first and second mounting bodies to said conductive bus; said first clamping surfaces being flat; said second clamping surfaces being normally convex toward their respective first clamping surfaces; said clamping means distorting said first clamping surfaces to conform to the shape of said second clamping surfaces.

6. The device substantially as set forth in claim 5 wherein said elongated conductive bus support has channels therein for conducting a cooling fluid.

7. The device substantially as set forth in claim 5 wherein said second terminal of each of said electrical devices is electrically connected to said elongated conductive bus.

8. The device substantially as set forth in claim 5 wherein said thin electrical insulation means comprises an insulation sheath surrounding said elongated bus support.

9. The device substantially as set forth in claim 5 wherein each of said mounting bodies have a general T-shaped cross-section; said electrical devices being secured to the web of said T; said first clamping surfaces being formed on the outer surface of the cross of said T.

References Cited by the Examiner

UNITED STATES PATENTS 2,994,203 8/1961 Lackey et al. ______ 317—100 X

ROBERT K. SCHAEFER, *Primary Examiner.*

KATHLEEN H. CLAFFY, *Examiner.*

W. C. GARVERT, *Assistant Examiner.*